United States Patent [19]

Horiguchi et al.

[11] Patent Number: 5,063,134
[45] Date of Patent: Nov. 5, 1991

[54] PHOTOSENSITIVE COMPOSITION

[75] Inventors: Rumiko Horiguchi, Yokohama; Shuzi Hayase, Kawasaki; Yasunobu Onishi, Yokohama, all of Japan

[73] Assignee: Kabushiki Kaisha Toshiba, Kawasaki, Japan

[21] Appl. No.: 455,783

[22] Filed: Jan. 2, 1990

Related U.S. Application Data

[63] Continuation of Ser. No. 173,546, Mar. 25, 1988, abandoned.

[30] Foreign Application Priority Data

Mar. 26, 1987 [JP] Japan .................................. 62-72113
Sep. 29, 1987 [JP] Japan .................................. 62-245497
Oct. 21, 1987 [JP] Japan .................................. 62-263965

[51] Int. Cl.$^5$ .......................... B03C 1/60; C03F 7/08; C08G 77/60
[52] U.S. Cl. ...................................... 430/192; 430/165; 430/190; 430/193; 430/195; 430/197; 430/312; 430/313; 430/323; 430/325; 430/326
[58] Field of Search ............... 430/192, 193, 190, 165, 430/312, 313, 323, 326, 197, 195, 325

[56] References Cited

U.S. PATENT DOCUMENTS

| | | | |
|---|---|---|---|
| 4,521,274 | 6/1985 | Reichmanis et al. | 430/313 |
| 4,536,464 | 8/1985 | Nagashima et al. | 430/192 |
| 4,603,195 | 7/1986 | Babich et al. | 534/564 |
| 4,624,909 | 11/1986 | Saotome et al. | 430/192 |
| 4,722,881 | 2/1988 | Ueno et al. | 430/192 |
| 4,788,127 | 11/1988 | Bailey et al. | 430/192 |

FOREIGN PATENT DOCUMENTS

| | | | |
|---|---|---|---|
| 53-135621 | 11/1978 | Japan | 430/191 |
| 62-80643 | 4/1987 | Japan | 430/192 |
| 62-159142 | 7/1987 | Japan | 430/191 |
| 62-255936 | 11/1987 | Japan | 430/192 |

OTHER PUBLICATIONS

English abstract of Japanese Publication #61-198,151, published 9/2/86 (Mitsubishi Chem.).
English abstract of Japanese Publication #60-59,347, published 4/5/85 (Tanaka).

*Primary Examiner*—Charles L. Bowers, Jr.
*Assistant Examiner*—Patrick Doody
*Attorney, Agent, or Firm*—Oblon, Spivak, McClelland, Maier & Neustadt

[57] ABSTRACT

A photosensitive composition contains a polymer having a unit represented by formula I, and a photosensitive agent:

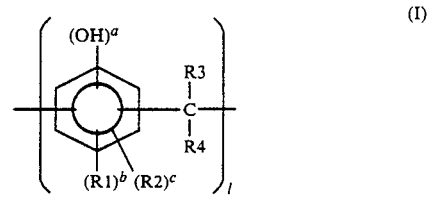

wherein each of $R_1$ to $R_4$ represents a hydrogen atom, an alkyl group, an alkoxyl group, or a substituted or non-substituted allyl group, at least one of $R_1$ to $R_4$ being an alkyl groups having 1 to 10 carbon atoms and containing silicon, l represents a positive integer, and each of a and b represents an integer from 1 to 3, and c represents an integer from 0 to 2, $a+b+c$ not exceeding 4.

16 Claims, No Drawings

PHOTOSENSITIVE COMPOSITION

This application is a continuation of application Ser. No. 07/173,546, filed on Mar. 25, 1988, now abandoned.

BACKGROUND OF THE INVENTION

1. Field of Invention

The present invention relates to a photosensitive composition used in lithography and, more particularly, to a photosensitive composition having an improved oxygen-plasma resistance.

2. Description of the Related Art

Lithography is an essential micro-patterning technique in the manufacture of such semiconductor devices as LSIs. As a result of the recent trend toward highly-integrating elements in an LSI, the elements are now not only micro-patterned but are also arranged three-dimensionally as in multilayer interconnection. However, as a consequence of three-dimensional arrangement having become adopted in semiconductor devices, the following new problem has arisen with regard to lithography.

In order to manufacture a three-dimensionally integrated device by use of lithography, a resist pattern must be formed on an underlying surface having a relatively large step. In order to accurately transfer a pattern of a mask onto a resist film which is formed on the underlying layer having a large step by exposure to light, the thickness of the resist film must be increased in order to ensure a flat resist film surface. However, an increase in the thickness of a resist film results in a decrease in resolution, this being for a variety of reasons.

One way of solving the above problem is to use a multilayer resist system (Solid State Technology, 74, 1981). The conventional multilayer resist system is a three-layer resist system in which three resist layers are employed, stacked one upon another. The function of the lowermost layer is to planarize the steps on the underlying surface and prevent light from reflecting therefrom, which would cause a reduction in resolution. The interlayer serves as an etching mask when the lowermost layer is patterned. A resist having excellent etching resistance, especially with respect to reactive ion etching using oxygen plasma (hereinafter referred to as oxygen-RIE resistance) is used as the interlayer. The uppermost layer serves as a photosensitive layer. According to this method, after the uppermost layer is exposed and developed, the interlayer is patterned, using the uppermost layer pattern as an etching mask, after which the lowermost layer is patterned, using the interlayer pattern as an etching mask.

As can be seen from the above description, each layer of the three-layer resist system performs a specific function such as one flattening an underlying surface and preventing light from reflecting therefrom, another providing the oxygen-RIE resistance, and another providing the required photosensitivity. According to this method, a finer resist pattern can be formed with high accuracy on an underlying surface having a step, as compared with a conventional monolayer resist system. However, the three-layer resist system requires that dry etching be repeated several times to form a pattern, with the result that the manufacturing process becomes undesirably complicated.

For this reason, a two-layer resist system has been developed (J. Vac. Sci. Technol. B3,306, 1985). In the two-layer resist system, a single layer serves as the uppermost layer and the interlayer in the three-layer resist system, thereby simplifying an etching process. This system makes use of a photosensitive silicon-containing polymer which has both satisfactory photosensitivity and oxygen-RIE resistance. Conventionally known examples of such a silicon-containing polymer are chloromethylated polysiloxane (Japanese Patent Disclosure No. 1985-59347), which has a chloromethylated benzene ring directly bonded to a silicon atom, and silicon-modified novolak resin (Japanese Patent Disclosure No. 1986-198151).

However, the above conventional two-layer resist system has the following drawbacks:

A conventional photosensitive composition comprising a silicon-containing polymer which is polymerized by radiation beams or lights requires the use of an organic solvent as a developing agent. For this reason, a pattern formed by the development process absorbs the organic solvent and swells thereby reducing the pattern accuracy.

In addition, novolak resin, in which a silicon atom is directly bonded to a benzene ring of a phenol-derivative residue, is very expensive because the yield of silicon-modified phenol, which is a monomer for the novolak resin, is extremely low.

SUMMARY OF THE INVENTION

It is, therefore, an object of the present invention to provide a photosensitive composition which can be suitably used as a photosensitive layer in a two-layer resist system.

More specifically, it is an object of the present invention to provide a photosensitive composition which can be developed by an aqueous alkali solution, which is less expensive than a photosensitive composition comprising a conventional silicon-containing polymer, and which has high oxygen-RIE resistance, high sensitivity, and high resolution.

The above object of the present invention can be achieved by a photosensitive composition (to be referred to as a first invention hereinafter) comprising:

a polymer having a unit represented by formula I; and
a photosensitive agent:

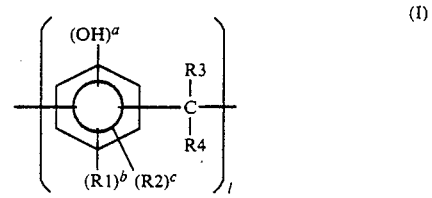

wherein each of $R_1$ to $R_4$ represents hydrogen atom, an alkyl group, an alkoxyl group, or a substituted or nonsubstituted allyl group, at least one of $R_1$ to $R_4$ being an alkyl group having 1 to 10 carbon atoms and containing silicon;

$l$ represents a positive integer; and each of a and b represents an integer from 1 to 3 and c represents an integer from 0 to 2, $a+b+c$ not exceeding 4.

The above object of the present invention can be achieved more suitably by a photosensitive composition (to be referred to as a second invention hereinafter) obtained by adding a polymer having a unit represented by formula II to the photosensitive composition of the above first invention.

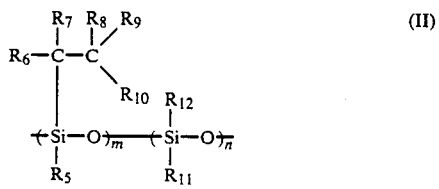

wherein $R_5$: an alkyl group having 1 to 10 carbon atoms or a substituted or nonsubstituted aryl group;

$R_6$ to $R_{10}$: a hydrogen atom, a halogen atom, an alkyl group, an allyl group, a halogenoalkyl group, a cyanoalkyl group, a carboxyl group, an alkylcarboxyl group, an alkoxycarboxyl group, an alkoxyl group, an acyloxy group, an aryl group, or an alkyl-substituted aryl group, at least one of $R_6$ to $R_{10}$ being an aryl group substituted by a hydroxyl group;

$R_{11}$ and $R_{12}$: a vinyl group, an allyl group, a γ-methacryloxypropyl group, an alkyl group having 1 to 10 carbon atoms, a substituted or nonsubstituted aryl group, or a substituted or nonsubstituted siloxyl group;

m: a positive integer; and n: 0 or a positive integer.

The photosensitive composition of the first invention consists of the polymer containing silicon represented by formula I and hence has a good oxygen-RIE resistance as a photosensitive composition used in the conventional two-layer resist system. That is, when the composition is subjected to oxygen RIE, a film consisting of a material such as $SiO_2$ or the like is formed on the surface of the composition and exhibits a good oxygen-RIE resistance. In addition, since the polymer represented by formula II contains silicon in its backbone chain, the oxygen-RIE resistance can be further improved in the photosensitive composition of the second invention.

The polymer represented by formula I contains a phenol group causing high solubility into aqueous alkali solutions. Therefore, the photosensitive compositions of both the first and second inventions can be developed by an aqueous alkali solution.

Furthermore, in order to manufacture the polymer represented by formula I, a monomer in which silicon is directly substituted in an aromatic ring is not required as will be described later. Therefore, this polymer can be manufactured at low cost as compared with a silicon-containing polymer used in the conventional two-layer resist system.

DETAILED DESCRIPTION OF THE PREFERRED EMBODIMENT

In the polymer having a unit represented by formula I, it is desirable for $R_3$ and/or $R_4$ to contain silicon whether $R_1$ and/or $R_2$ may or may not contain silicon. Where each of $R_1$ (and/or $R_2$) and $R_3$ (and/or $R_4$) contains silicon, the oxygen-RIE resistance can be improved because of the high silicon content. Where $R_3$ (and/or $R_4$) alone contains silicon, the compound is advantageous in its high solubility in alkali, compared with the case where $R_1$ (and/or $R_2$) alone contains silicon and $R_3$ (and/or $R_4$) does not contain silicon.

A polymer having a unit represented by formula I can be obtained by a condensation reaction between a phenol-containing compound and an aldehyde or ketone.

This condensation reaction is represented by two methods as will be described below depending on whether an alkyl group having 1 to 10 carbon atoms and containing silicon is included in the phenol-containing compound or in the aldehyde or ketone. Note that examples of the alkyl group having 1 to 10 carbon atoms are a methyl group, an ethyl group, an n-propyl group, an iso-propyl group, an n-butyl group, a sec-butyl group, a ter-butyl group, a heptyl group, a hexyl group, an octyl group, a nonyl group, and a decyl group.

In the first method, the alkyl group containing silicon is included in the phenol-containing compound. In this method, an organic silicon compound represented by formula III or IV is condensed with an aldehyde

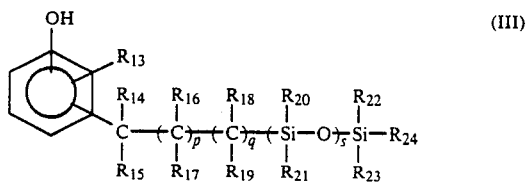

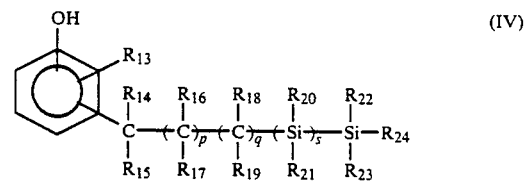

wherein $R_{13}$: a hydrogen atom, a hydroxyl group, or an alkoxyl group;

$R_{14}$ to $R_{24}$: a hydrogen atom, an alkyl group having 1 to 10 carbon atoms, a substituted or nonsubstituted phenyl group, or a substituted or nonsubstituted naphthyl group ($R_{14}$ to $R_{24}$ may be either the same or different);

p, q: 0 or 1; and s: 0 or a positive integer.

Examples of the substituted or nonsubstituted phenyl or naphthyl group in formula III or IV are phenyl, p-tolyl, p-methoxyphenyl, p-chlorophenyl, p-trifluoromethylphenyl, o-tolyl, o-methoxyphenyl, p-trimethylphenyl, 1-naphthyl, 2-naphthyl, 6-methoxy-2-naphthyl, and 6-ethoxy-2-naphthyl.

Examples of the compound represented by formula III are summarized in Table 1 below.

TABLE 1

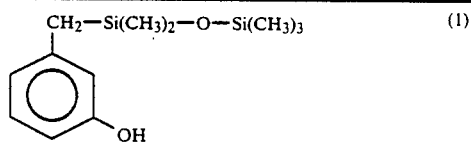  (1)

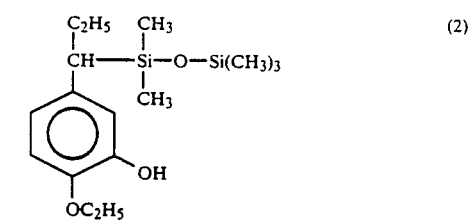  (2)

TABLE 1-continued
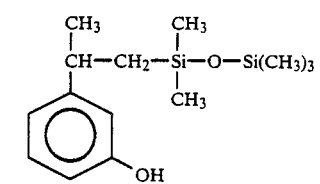 (3)
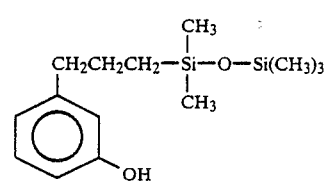 (4)
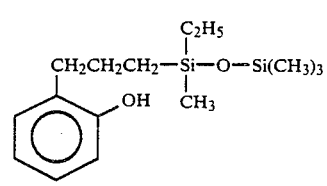 (5)
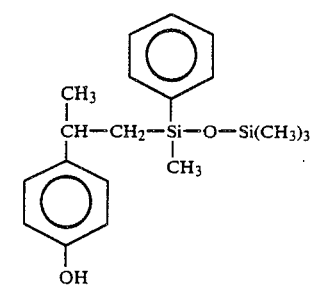 (6)
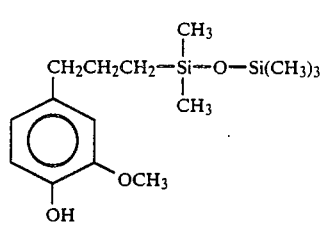 (7)
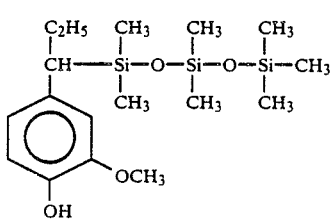 (8)
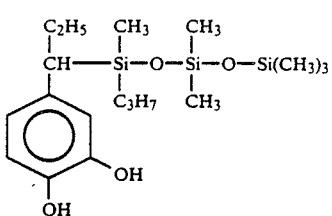 (9)
TABLE 1-continued
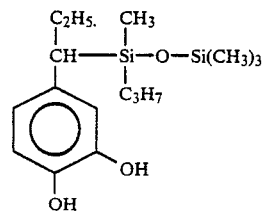 (10)
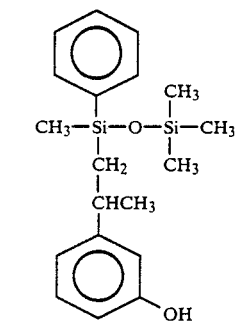 (14)
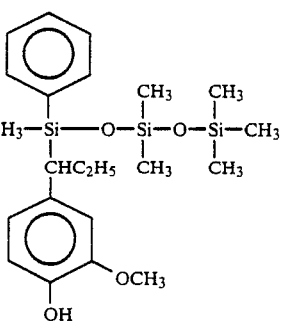 (15)
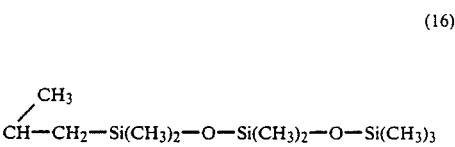 (16)
Examples of the compound represented by formula IV are summarized in Table 2 below.
TABLE 2
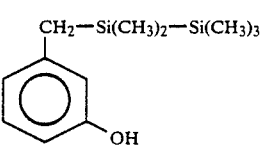 (17)
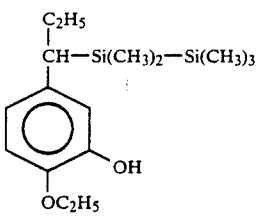 (18)

TABLE 2-continued

(19) 3-(CH(CH₃)-CH₂-Si(CH₃)₂-Si(CH₃)₃)-phenol

(20) 3-(CH₂CH₂CH₂Si(CH₃)₂Si(CH₃)₃)-phenol

(21) 2-(CH₂CH₂CH₂-Si(C₂H₅)(CH₃)-Si(CH₃)₃)-phenol

(22) 4-(CH(CH₃)-CH₂-Si(C₆H₅)(CH₃)-Si(CH₃)₃)-phenol

(23) 4-(CH₂CH₂CH₂-Si(CH₃)₂-Si(CH₃)₃)-2-methoxyphenol

(24) 4-(CH(C₂H₅)-Si(CH₃)₂-Si(CH₃)₂-Si(CH₃)₃)-2-methoxyphenol

(25) 4-(CH(C₂H₅)-Si(CH₃)(C₃H₇)-Si(CH₃)₂-Si(CH₃)₃)-benzene-1,2-diol

(26) 4-(CH(C₂H₅)-Si(C₂H₅)₂-C₂H₅)-2-methoxyphenol

(27) 4-(CH(C₂H₅)-Si(CH₃)₂-CH₃)-2-methoxyphenol (with OH at 4-position)

(28) 3-(CH(CH₃)-CH₂-Si(CH₃)₂-CH₃)-phenol

(29) 4-(CH₂CH₂CH₂-Si(CH₃)₂-CH₃)-2-methoxyphenol

(30) substituted phenol with Si(CH₃)₂CH₃ group, CHC₂H₅, OH and OC₂H₅ substituents

(31) 4-(CH(C₂H₅)-Si(C₆H₅)(CH₃)-CH₃)-2-methoxyphenol

TABLE 2-continued

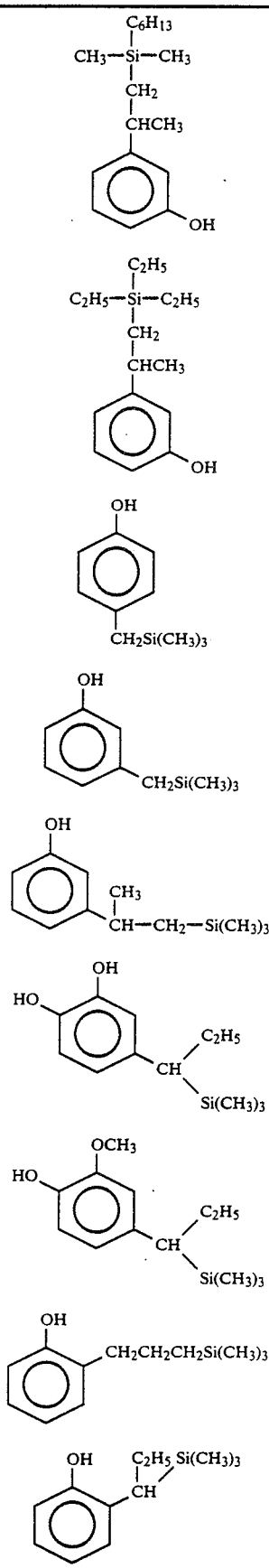

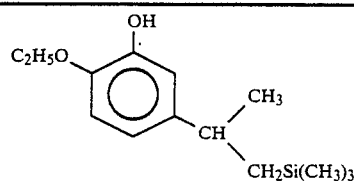

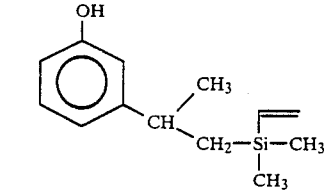

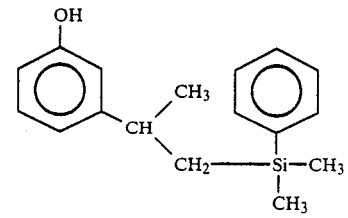

By condensing the above organic silicon compound using formalin in accordance with a conventional method, a novolak resin having the unit represented by formula I can be obtained.

In the second method, the alkyl group represented by formula I having 1 to 10 carbon atoms and containing silicon is included in the aldehyde or ketone. In this method, a carbonyl compound represented by formula V is condensed with a phenol or phenol-derivative.

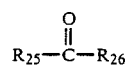

In above formula V, each of $R_{25}$ and $R_{26}$ represents a hydrogen atom, allyl group or an alkyl group containing silicon and having 1 to 15 carbon atoms. In this case, at least one of $R_{25}$ and $R_{26}$ is an alkyl group containing silicon and having 1 to 15 carbon atoms.

Examples of the carbonyl compound represented by formula V are as follows. These compounds may be used singly or in a combination of two or more compounds.

CHOCH$_2$CH$_2$Si(CH$_3$)$_3$

CHO(CH$_2$)$_4$Si(CH$_3$)$_3$

CHO(CH$_2$)$_5$Si(CH$_3$)$_3$

CHO(CH$_2$)$_{10}$Si(CH$_3$)$_3$

CHOCH$_2$CH$_2$Si(CH$_3$)$_2$OSi(CH$_3$)$_3$

CHOCH$_2$CH$_2$SiPhMeOSi(Ph)$_3$ [wherein Ph represents a phenyl group, Me represents a methyl group]

CHOCH$_2$CH$_2$Si(CH$_3$)$_2$Si(CH$_3$)$_3$

CHOCH$_2$CHSi(CH$_3$)$_2$OSi(CH$_3$)$_3$
             |
             CH$_3$

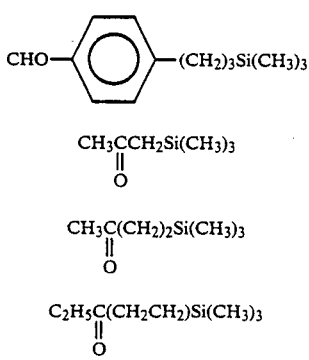

Examples of the phenol or phenol derivative used for condensation with the carbonyl compound represented by formula V are phenol, cresol, xylenol, ethylphenol, propylphenol, butylphenol, dihydroxybenzene, trihydroxybenzene, and the phenol compound represented by formula III, IV.

Note that in the polymer having the unit represented by formula I, the oxygen-RIE resistance is improved as a silicon content is increased. In this case, however, the photo sensitivity of the photosensitive composition according to the present invention is reduced. Therefore, when the above first manufacturing method is used, the silicon content is preferably controlled by adding a phenol or phenol derivative not containing silicon in addition to the organic silicon compound represented by formula III or IV. In this case, a ratio of the organic silicon compound represented by formula III or IV is preferably 20 to 80 mol %. Examples of the phenol derivative are o-chlorophenol, m-chlorophenol, p-chlorophenol, m-cresol, p-cresol, xylenol, bisphenol A, 4-chloro-3-cresol-dihydroxybenzene, and trihydroxybenzene.

As is described above, the silicon-containing polymer having the unit represented by formula I used in the photosensitive compositions of the first and second inventions can be obtained at relatively low cost because an expensive monomer in which silicon is directly bonded to the benzene ring is not required when the polymer is manufactured.

The polymer represented by formula II used in the second invention will be described below.

Examples of an alkyl group having 1 to 10 carbon atoms used in formula II are the same as those enumerated for formula I. Examples of a substituted or nonsubstituted allyl group are the substituted or nonsubstituted phenyl or naphthyl group as described above with reference to formula III. Note that in the second invention, a mixing ratio of polymer (A) having the unit represented by formula I and polymer (B) having the unit represented by formula II can be arbitrarily set. However, in order to obtain a desired oxygen-RIE resistance and a desired heat resistance, A/(A+B) is preferably 20 to 80 wt %.

The unit of formula II consists of a portion having a ratio represented by m and that having a ratio represented by n. Examples of the portion having ratio m and that having ratio n are listed in Tables 3 and 4 below, respectively.

TABLE 3

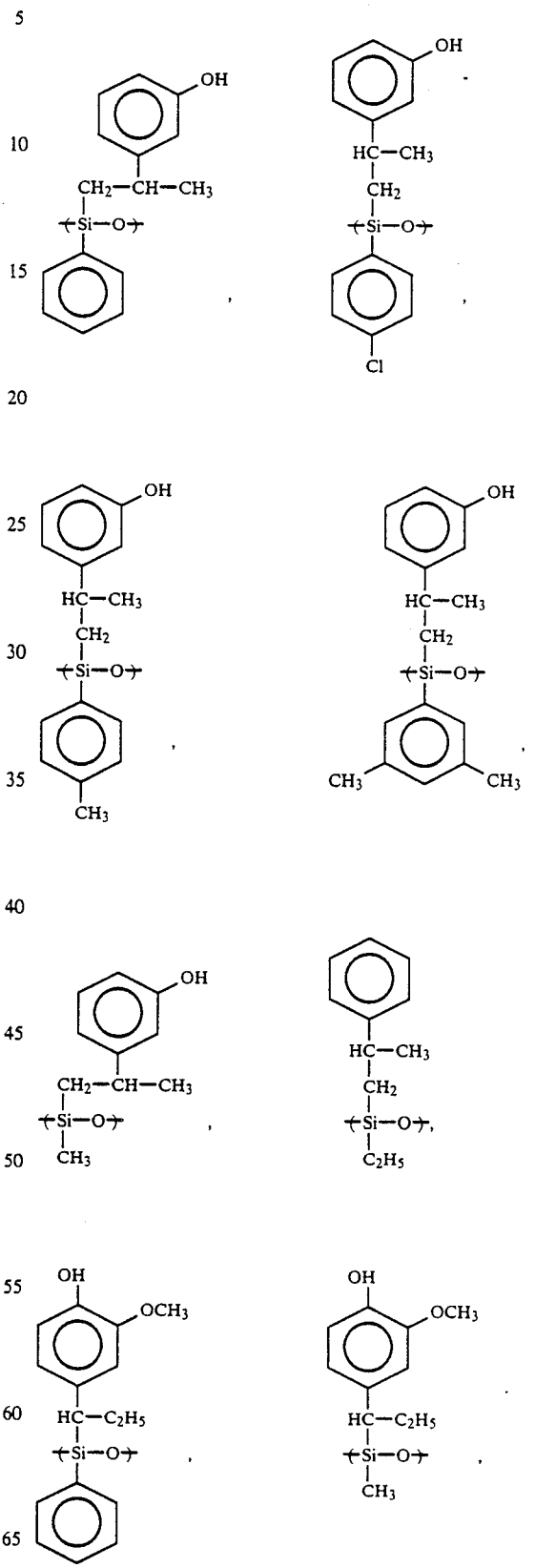

TABLE 3-continued

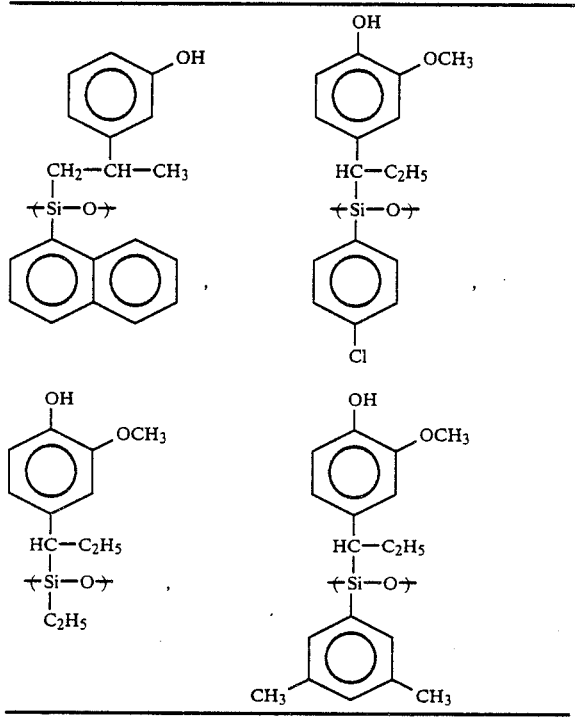

TABLE 4

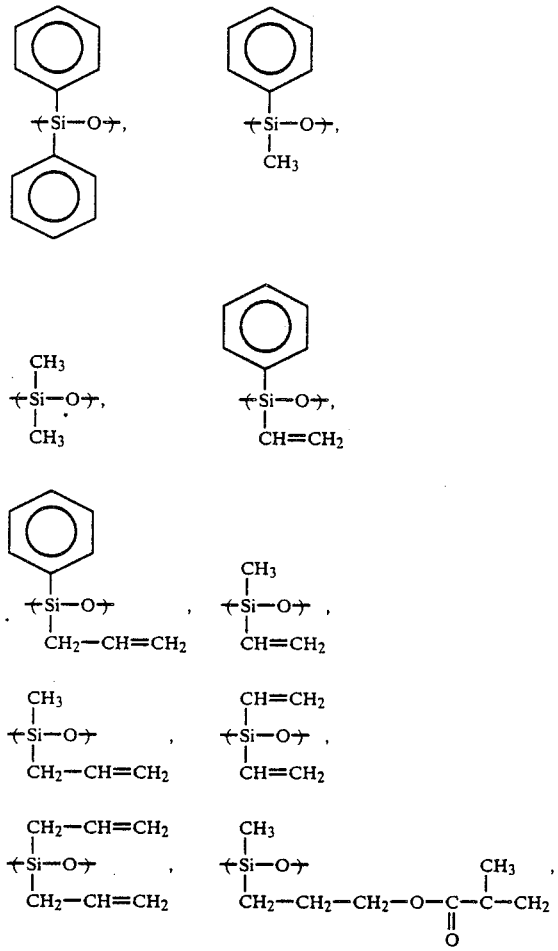

TABLE 4-continued

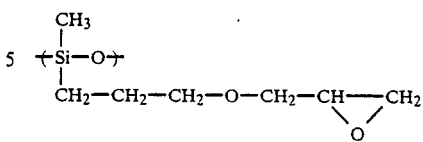

Now, a photosensitive agent used in the photosensitive compositions of the first and second inventions will be described below. This photosensitive agent may be of any type as long as it has sensitivity with respect to a wavelength of a light source used in an exposure apparatus. Either a negative type photosensitive agent such as an azide compound or a positive type photosensitive agent such as a diazo-compound may be used.

AZIDE COMPOUND

Examples of a first category are those used in a conventional photosensitive composition such as 4,4'-diazidechalcone, 2-methoxy-4'-azidechalcone, 1-(p-azidophenyl)-4-(2-furyl)-1,3-butadiene, 2,6-bis(azidobenzal)-cyclohexanone, 2,6-bis(4'-azidobenzal)-4-methylenecyclohexanone, 1,3-bis(4'-azidobenzal)-2-propanone, 1,3-bis(4'-azidocinnamylidene)-2-propanone, 4,4'-diazidostilbene, 4,4'-diazidobiphenyl, 4,4'-diazidodiphenylsulfide, 3,3'-diazidodiphenylsulfide, 4,4'-diazidodiphenylsulfone, 3,3'-diazidodiphenylsulfone, and 4,4'-diazidestilbene.

A second category is a compound containing a naphthoquinonediazide group or a benzoquinonediazide group. This compound can be obtained by condensing a naphthoquinonediazide sulfonic acid chloride or a benzoquinonediazide sulfonic acid chloride with a low- or high-molecular weight compound having a phenolic hydroxyl group in the presence of a weak alkali. Examples of the low-molecular compound to be condensed are hydroquinone, resorcin, phloroglucin, 2,4-dihydroquinone-benzophenone, 2,3,4-trihydroxy-benzophenone, 2,4,2',4'-tetrahydroxy-benzophenone, 2,3,4,4'-tetrahydroxy-benzophenone, 3,4,5-trihydroxybenzoic acid ethyl ester, gallic acid alkyl ester, catechin, quercetin, morin-alizarin, quinalizarin, and purpurin. Examples of the high-molecular compound to be condensed are a phenol-formaldehyde novolak resin, a cresol-formaldehyde novolak resin, and polyhydroxystyrene. In the above second category, naphthoquinonediazide sulfonic acid ester is preferable.

The above photosensitive agents can be used singly or in a combination of two or more agents. In an exposure apparatus currently widely used, a g-line (wavelength=436 nm) of a mercury emission spectrum is used as a light source. Therefore, a photosensitive agent having sensitivity with respect to light having a wavelength of 436 nm can be suitably used. Examples of such a photosensitive agent are bis(1-naphthoquinone-2-diazido-5-sulfonic acid)-2,3,4-trihydroxybenzophenone ester, and 1-(p-azidophenyl)-4-(2-furyl)-1,3-butadiene.

In either the first or second invention, an amount of the above photosensitive agent is preferably 5 to 100 parts by weight with respect to 100 parts by weight of the polymer. When the amount of the photosensitive agent is less than 5 parts by weight, a sufficient solubility difference is not produced between exposed and unexposed portions. Therefore, it is difficult to form a good pattern. On the contrary, when the amount exceeds 100 parts by weight, the film formation property of the photosensitive composition is reduced.

Optional additional components in the photosensitive composition of the present invention will be described below.

A first example of the optional component is an alkali-soluble resin which is soluble in an aqueous alkali solution. This resin is added to improve the film formation property of the photosensitive composition and to compensate for solubility in an aqueous alkali solution as a developer. A the alkali-soluble resin, any resin can be used as long as it is dissolved in an aqueous alkali solution. Examples of the resin are poly(p-vinylphenol), poly(o-biphenylphenol), poly(m-isopropenylphenol), poly(o-isopropenylphenol), a commercially available novolak resin such as a phenol novolak resin or p-crezol novolak resin, a copolymer of p-vinylphenol and methyl methacrylate, a copolymer of p-isoprophenylphenol and maleic anhydride, a copolymer of p-hydroxystyrene and methacrylic acid, partially benzoylated poly(p-vinylphenol), poly(methacrylic acid), and poli(acrylic acid). Of the above examples, the resin having the phenolic hydroxy group is preferable. Especially, poly(p-vinylphenol) or the copolymer of poly(p-vinylphenol) and methyl methacrylate is preferable.

The above alkali-soluble resin can be used singly or in a combination of two or more resins. In either the first or second invention, an addition amount of the resin is preferably 5 to 100 parts by weight with respect to 100 parts by weight of the polymer having a unit of formula I and/or II. If the amount is too small, the film formation property cannot be improved. On the contrary, if the amount is too large, the oxygen-RIE resistance is reduced.

Other optional additional components are, e.g., a UV absorbent, a thermal-polymerization inhibitor for increasing storage stability, an antihalation agent for preventing halation from a substrate, an adhesion improving agent for improving adhesion between a applied film of the photosensitive composition and the substrate, and a leveling agent such as a surface active agent for flattening the film surface.

The photosensitive composition of the present invention is dissolved in a suitable solvent and the applied on a suitable substrate. Examples of the solvent are a solvent of the ketone series such as acetone, methyl ethyl ketone, methyl isobutyl ketone, or cyclohexanone; a solvent of the cellosolve series such as methyl cellosolve, methyl cellosolve acetate, or ethyl cellosolve acetate; and a solvent of the ester series such as ethyl acetate, butyl acetate, or isoamyl acetate.

A method of applying the photosensitive composition of the present invention to the two-layer resist system for forming a pattern will be described below.

First, a planarizing agent is applied on a substrate and dried, thereby forming a planarization layer having a predetermined thickness and a flat surface. Examples of the substrate are a silicon wafer on which an IC is to be formed (this wafer may already have various insulating layers, electrodes, and wirings and hence have a relatively large step) and a blank mask (a quartz plate) for manufacturing an exposure mask. As the planarizing agent, a high-molecular material from which a thin film can be formed and which has sufficient purity not adversely affecting the manufacture of a semiconductor device is used. Examples of the high-molecular material are a positive-type photo resist mainly consisting of a novolak resin and substitute naphthoquinonediazide, poystyrene, polymethacrylate, polyvinylphenol, a novolak resin, polyester, polyvinylalcohol, polyethylene, polypropylene, polyimide, polybutadiene, polyvinyl acetate, and polyvinyl butyral. These planarizing agents may be used singly or in a combination of two or more agents. In order to absorb light reflected from the substrate surface, a light absorbing agent may be added.

The planarizing agent as described above is dissolved in a solvent and then applied on the substrate. Examples of the solvent for forming the solution are toluene, xylene, ethyl cellosolve acetate, and cyclohexanone. The viscosity of the solution is preferably 20 to 100 cps, and more preferably, 60 to 100 cps. A thickness of the planarization layer is preferably 1 to 2 $\mu$m, and more preferably, 1.5 to 2.0 $\mu$m. When the thickness of the planarization layer is less than 1 $\mu$m or less, planarization cannot be achieved. On the contrary, when the thickness exceeds 2 $\mu$m, resolution is reduced.

Note that baking may be performed after the solution of the planarizing agent is applied and dried. In this case, a baking temperature is set to be high enough to evaporate the solvent and higher than a glass transition temperature of the planarizing agent. Baking is normally performed at 50° to 250° C. for 0.5 to 120 minutes, and preferably, 80° to 220° C. for 1 to 90 minutes.

Then, a solution of the photosensitive composition of the present invention is applied and dried on the planarization layer formed as described above, thereby forming a photosensitive layer consisting of the photosensitive composition. Examples of the solvent for forming the solution are as described above. Examples of an applying method are spinning application using a spinner, dipping, spraying, and printing. When the spinner is used, the viscosity of the solution is preferably 10 to 100 cps, and more preferably, 10 to 60 cps. If the photosensitive layer is too thin, a sufficient oxygen-RIE resistance cannot be obtained. On the contrary, if the layer is too thick, resolution is reduced. Therefore, the thickness of the photosensitive layer is preferably 0.2 to 1.2 $\mu$m, and more preferably, 0.3 to 0.8 $\mu$m.

Then, light such as visible light, infrared rays, ultraviolet rays, or electron beam is radiated through a mask to selectively expose a desired region of the photosensitive layer. As a result, a difference is produced between solubilities in the developing agent in exposed and unexposed portions. As an exposure method, either contact exposure or projection exposure may be used. Although an exposure amount depends on the type of a used photosensitive composition, it is normally 10 to 1,000 mJ/cm$^2$.

Subsequently, the exposed photosensitive layer is developed to form a desired upper resist pattern. Examples of the developing agent are aqueous alkali solutions such as an aqueous tetramethylammonium hydroxide solution, an aqueous choline solution, an aqueous ammonium hydroxide solution, an aqueous sodium hydroxide solution, and an aqueous potassium hydroxide solution. In general, the concentration of the aqueous alkali solution is 15 wt % or less. As described above, according to the present invention, the aqueous alkali solutions can be used as the developing agent. As a developing method, dipping, spraying, or the like may be used. In this development, the exposed portion (in the case of a positive type) or the unexposed portion (in the case of the negative type) is dissolved, thereby forming a desired pattern. After development, the developing agent is removed by washing.

Then, the underlying planarization layer is patterned by oxygen-plasma RIE using the upper resist pattern as a mask. At this time, since the upper resist pattern is exposed to oxygen plasma, a thin film having a composition close to $SiO_2$ is formed on its surface. By this thin film, the oxygen-RIE resistance of the upper resist pattern is increased to 10 to 100 times that of the underlying planarization layer. Therefore, the upper resist pattern can serve as an etching mask. As a result, the planarization layer is patterned in accordance with the upper resist pattern with high accuracy. For this reason, a resist pattern having a stacking structure consisting of the upper resist pattern and the planarization layer pattern and a good profile is obtained. Note that the oxygen RIE is normally performed for 1 to 120 minutes under the conditions of $1 \times 10^{-5}$ to $1 \times 10^{-1}$ torr and 50 to 500 W.

The substrate is subjected to a treatment such as selective etching using a resist pattern of the two-layer structure obtained as described above as an etching mask. Etching may be performed, either by wet etching or by dry etching. However, dry etching is preferable to form a fine pattern of 3 $\mu$m or less. An etchant used in wet etching depends on a substrate material to be etched. For example, an aqueous hydrofluoric acid solution or an aqueous ammonium fluoride solution is used to etch a silicon oxide film; an aqueous phosphoric acid solution, an aqueous acidic acid solution, or an aqueous nitric acid solution is used to etch aluminum; and an aqueous cerium ammonium nitrate solution is used to etch a chromium material. Examples of an etching gas used in dry etching are $CF_4$, $CHF_3$, $C_2F_6$, $CCl_4$, $BCl_3$, $Cl_2$, and $HCl$. These etching gases may be used in a combination as needed. In either of the above etching methods, detailed conditions for etching are arbitrarily set in accordance with on object to be etched and the type of a resist pattern used as an etching mask.

After the treatment is finished, the resist pattern of the residual two-layer structure on the substrate surface is removed by a resist removing agent or by ashing using oxygen plasma. An example of the resist releasing agent is "J-100" (tradename) available from Nagase Kasei K.K.

Note that in the above two-layer resist system, other steps can be added as needed. Examples are a pretreatment step for improving adhesion between the photosensitive and the planarization layer or the planarization layer and the substrate, a baking step performed before and after development, and an ultraviolet ray re-radiating step performed before dry etching.

The photosensitive composition of the present invention can be applied not only to the above two-layer resist system but also to lithography using a conventional monolayer resist system.

The present invention will be described in detail by way of its Examples.

EXAMPLE 1

Preparation of Photosensitive Composition

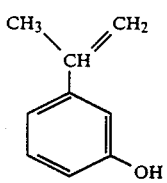

100 mmol of m-isopropenylphenol represented by the above formula and 100 mmol of pentamethyldisiloxane were reacted in the presence of a platinum catalyst. As a result, 80 mmol of m-phenolsiloxane represented by the following formula were obtained as a product of an addition reaction.

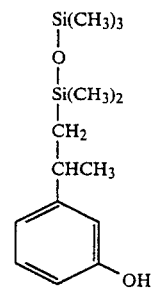

Subsequently, 30 mmol of m-cresol, 40 mmol of p-cresol, and 100 mmol of an aqueous formaldehyde solution (37%) were added to the above m-phenolsiloxane, and the resultant solution was stirred and heated up to 100° C. 1.8 mmol of oxalic acid were added to the solution and reacted at 100° C. for 4 hours. Thereafter, water and an unreacted monomer are removed by fractional distillation at a reduced pressure, thereby obtaining 22 g of a novolak resin.

10 g of the above novolak resin and 3 g of bis(1,2-naphthoquinone-2-diazido-5-sulfonic acid)-2,3,4-trihydroxybenzophenone ester were dissolved in 25 g of ethyl cellosolve acetate and stirred, thereby preparing a photosensitive composition.

Application to Photolithography

A commercially available positive-type resist comprising a novolak resin was applied on a silicon wafer to a thickness of 2.0 $\mu$m. Subsequently, the photosensitive composition of this Example was applied on the flattening layer through a 0.2-$\mu$m thick filter, thereby forming a 0.6-$\mu$m thick photosensitive layer.

Then, the resultant material was prebaked at 90° C. for five minutes, exposed using light having a wavelength of 436 nm (50 mJ/cm²), and heated using a hot plate at 80° C. for five minutes. Subsequently, the resultant material was dipped in an aqueous tetramethyl ammonium hydroxide solution (2.38 wt %) to form an upper resist pattern. By performing the oxygen-RIE using the upper resist pattern as a mask, the underlying flattening layer was patterned.

A section of the resist pattern formed as described above was observed by a scanning electron microscope. As a result, it was confirmed that the resist patterns with perpendicularly steep side face and the spaces therebetween were formed. Each line and each space had a width of 0.5 $\mu$m. The thickness of the resist pattern was 2.3 $\mu$m.

EXAMPLE 2

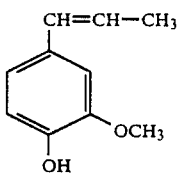

100 mmol of p-isopropenyl-m-methoxyphenol represented by the above formula and 100 mmol of triethylsilane were reacted in the presence of a platinum catalyst to obtain 75 mmol of guaiacolsilane represented by the following formula as a product of an addition reaction product.

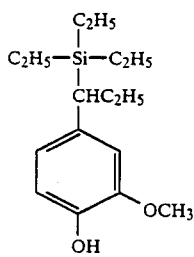

Subsequently, 75 mmol of m-cresol, 75 mmol of p-cresol, and 150 mmol of an aqueous formaldehyde solution (37%) were added to the above guaicolsilane, and the resultant solution was stirred and heated up to 100° C. 3 mmol of oxalic acid were added to the solution and reacted at 100° to 105° C. for four hours. Thereafter, the water and an unreacted monomer were removed by fractional distillation at a reduced pressure thereby obtaining 18 g of a novolak resin.

10 g of the novolak resin obtained as described above and 3 g of bis(1-naphthoquinone-2-diazido-5-sulfonic acid)-2,3,4-trihydroxybenzophenone ester were dissolved in 25 g of ethyl cellosolve acetate and stirred to prepare a photosensitive composition.

EXAMPLE 3

An organic silicon compound represented by formula (7) in Table 1 and m-cresol were condensed in a molar ratio of 7:3 to obtain a novolak resin.

Bis(1-naphthoquinone-2-diazido-5-sulfonic acid)-2,3,4-trihydroxybenzophenone ester as a photosensitive agent was added to the above novolak resin in an amount of 20 wt %. Subsequently, the resultant mixture was dissolved in cellosolve acetate and stirred to prepare a photosensitive composition.

EXAMPLE 4

An organic silicon compound represented by formula (2) in Table 1 and m-cresol were condensed in a molar ratio of 7:3 to synthesize a novolak resin.

Bis(1-naphthoquinone-2-diazido-5-sulfonic acid)-2,3,4-trihydroxybenzophenone ester as a photosensitive agent was added to the above novolak resin in an amount of 20 wt %. Subsequently, the resultant mixture was dissolved in ethyl cellosolve acetate and stirred to prepare a photosensitive composition.

EXAMPLE 5

An organic silicon compound represented by formula (6) in Table 1 and m-cresol were condensed in a molar ratio of 7:3 to synthesize a novolak resin.

Bis(1-naphthoquinone-2-diazido-5-sulfonic acid)-2,3,4-trihydroxybenzophenone ester as a photosensitive agent was added to the above novolak resin in an amount of 25 wt %. Subsequently, the resultant mixture was dissolved in ethyl cellosolve acetate and stirred to prepare a photosensitive composition.

EXAMPLE 6

An organic silicon compound represented by formula (8) in Table 1, m-cresol and p-cresol were condensed in a molar ratio of 6:2:2 to synthesize a novolak resin.

Bis(1-naphthoquinone-2-diazido-5-sulfonic acid)-2.3.4-trihydroxybenzophenone ester as a photosensitive agent was added to the above novolak resin in an amount of 25 wt %. Subsequently, the resultant mixture was dissolved in ethyl cellosolve acetate and stirred to prepare a photosensitive composition.

EXAMPLE 7

An organic silicon compound represented by formula (10) in Table 1 and m-cresol were condensed in a molar ratio of 5:5 to synthesize a novolak resin.

Bis(1-naphthoquinone-2-diazido-5-sulfonic acid)-2,3,4-trihydroxybenzophenone ester as a photosensitive agent was added to the above novolak resin in an amount of 25 wt %. Subsequently, the resultant mixture was dissolved in ethyl cellosolve acetate and stirred to prepare a photosensitive composition.

EXAMPLE 8

An organic silicon compound represented by formula (14) in Table 1 and m-cresol were condensed in a molar ratio of 6:4 to synthesize a novolak resin.

Bis(1-naphthoquinone-2-diazido-5-sulfonic acid)-2,3,4-trihydroxybenzophenone ester as a photosensitive agent was added to the above novolak resin in an amount of 18 wt %. Subsequently, the resultant mixture was dissolved in ethyl cellosolve acetate and stirred to prepare a photosensitive composition.

EXAMPLE 9

An organic silicon compound represented by formula (19) in Table 2 and m-cresol were condensed in a molar ratio of 5:5 to synthesize a novolak resin.

Tris(1-naphthoquinone-2-diazido-5-sulfonic acid)-2,3,4,4'-tetrahydroxybenzophenone ester as a photosensitive agent was added to the above novolak resin in an amount of 20 wt %. Subsequently, the resultant mixture was dissolved in ethyl cellosolve acetate and stirred to prepare a photosensitive composition.

EXAMPLE 10

An organic silicon compound represented by formula (35) in Table 2 and m-cresol were condensed in a molar ratio of 6:4 to synthesize a novolak resin.

Bis(1-naphthoquinone-2-diazido-5-sulfonic acid)-2,3,4-trihydroxybenzophenone ester as a photosensitive agent was added to the above novolak resin in an amount of 20 wt %. Subsequently, the resultant mixture was dissolved in cellosolve acetate and stirred to prepare a photosensitive composition.

EXAMPLE 11

Application Test for Photolithography

Following the same procedures as in Example 1, photolithography according to the two-layer resist system was performed using the photosensitive compositions obtained in Examples 2 to 10.

Then, a section of a formed resist pattern was observed by a scanning electron microscope. As a result, it was confirmed that the resist patterns with good profile and spaces therebetween were formed and that each pattern and each space have a width of 0.5 μm.

EXAMPLE 12

7 g of the novolak resin synthesized in Example 1, 20 g of bis(1-naphthoquinone-2-diazide-5-sulfonic acid)-2,3,4-trihydroxybenzophenone ester, and 3 g of a commercially available novolak resin obtained by condensing m-cresol and p-cresol in a molar ratio of 6:4 were dissolved in 25 g of cyclohexanone and stirred to prepare a photosensitive composition.

Following the same procedures as in Example 1, photolithography according to the two-layer resist system was performed using the above photosensitive composition. Then, a section of a formed flattening layer pattern was observed by a scanning electron microscope. As a result, it was confirmed that the resist patterns with good profile and spaces therebetween were formed. Each line and each space had a width of 0.5 μm.

EXAMPLES 13-18

In each of Examples, a phenol derivative and a carbonyl compound represented by formula V were condensed in accordance with the second method described above, thereby synthesizing a silicon-containing polymer represented by formula I. The phenol derivatives and carbonyl compounds represented by formula V used in the above Examples are listed in Tables 6 and 7 below.

Then, the above polymers and photosensitive agents were dissolved in ethylcellosolve acetate to prepare photosensitive compositions of the respective Examples. The photosensitive agents used in the Examples and amounts are summarized in Tables 6 and 7.

The photosensitive compositions obtained in the respective Examples were applied to the two-layer resist system as will be described below.

First, a solution of novolak resist "OFPR-800" (tradename) available from Tokyo Oyo Kagaku K.K. was applied and dried on a silicon substrate. Then, the resultant structure was heated at 200° C. for an hour to form a 1.5-μm thick flattening layer. Subsequently, the photosensitive composition of each Example was applied and dried on the flattening layer to form a 0.6-μm thick photosensitive layer. Then, exposure and development were performed under the conditions listed in Tables 6 and 7, thereby forming an upper resist pattern having a line and a space of 0.5 μm.

Thereafter, the flattening layer was patterned by oxygen RIE using the upper resist pattern as an etching mask by dry etching apparatus "HiRRIE" (tradename) available from Tokuda Seisakusho K.K. Conditions of the oxygen RIE were an output of 300 W/cm$^2$, an oxygen gas pressure of 4 pa, and a flow rate of 50 SCCM.

In the above two-layer resist system, the oxygen-RIE resistance of the upper resist pattern and resolution of the formed resist pattern of a two-layer structure were examined. Results are summarized in Tables 6 and 7 below. Note that the oxygen-RIE resistance of the upper resist pattern was represented as a ratio with respect to the oxygen-RIE resistance of the flattening layer.

In the tables, D* and Q represent the following group respectively.

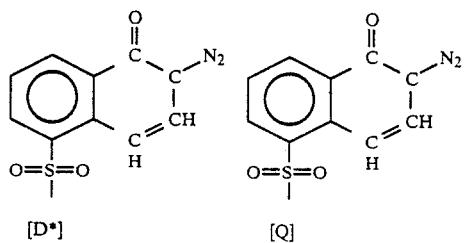

TABLE 6

| | Condensate | | Photosensitive agent | | Process condition | | | | Evaluation |
|---|---|---|---|---|---|---|---|---|---|
| | (a) Phenol-containing compound | (b) Carbonyl compound of formula (V) | Type | To Condensate (wt %) | Exposure light | Exposure amount (Sensitivity) | Developer | Oxygen-RIE resistance with respect to flattening layer | Two-layer pattern resolution (μm) |
| Example 13 | 3-methylphenol (OH, CH₃) | H-C(=O)-CH₂CH₂Si(CH₃)₃ | (A) benzophenone with OH, OD*, OD* substituents | 25 | g-line | 70 mJ/cm² | Aqueous NaOH solution | 7 times | 0.5 |
| Example 14 | resorcinol (OH, OH) | H-C(=O)-CH(CH₃)CH₂Si(CH₃)₃-O-Si(CH₃)₃ | (B) benzophenone with OD*, OD*, OH substituents | 30 | g-line | 50 mJ/cm² | Aqueous Tetramethylammonium hydroxide (TMAH) solution | 20 times | 0.5 |
| Example 15 | resorcinol (OH, OH) | H-C(=O)-CH(phenyl)CH₂CH₂Si(CH₃)₃-O-Si(CH₃)₃ | (C) CN, N₃-substituted phenyl C=CHCH=CH-furan | 30 | g-line | 50 mJ/cm² | Aqueous TMAH solution | 20 times | 0.5 |

TABLE 7

| | Condensate | | Photosensitive agent | | Process condition | | | Oxygen-RIE resistance with respect to flattening layer | Evaluation Two-layer pattern resolution (μm) |
|---|---|---|---|---|---|---|---|---|---|
| | (a) Phenol-containing compound | (b) Carbonyl compound of formula (V) | Type | To Condensate (wt %) | Exposure light | Exposure amount (Sensitivity) | Developer | | |
| Example 16 | HO–⟨C₆H₄⟩–OH | H–C(=O)–CCH₂CH₂Si(CH₃)(CH₃)–O–Si(CH₃)₃ | (Same as A) of Table 6 | 27 | g-line | 50 mJ/cm² | Aqueous TMAH solution | 20 times | 0.5 |
| Example 17 | HO–⟨C₆H₄⟩–OH | H–C(=O)–CCH₂CH₂Si(CH₃)(C₆H₅)–Si(CH₃)₃ | (Same as A) of Table 6 | 27 | g-line | 90 mJ/cm² | Aqueous TMAH solution | 16 times | 0.5 |
| Example 18 | HO–⟨C₆H₄(OH)⟩–OH | H–C(=O)–CCH₂CH₂Si(C₆H₅)(C₆H₅)–O–Si(CH₃)₃ | (Same as B) of Table 6 | 30 | g-line | 50 mJ/cm² | Aqueous TMAH solution | 15 times | 0.5 |

EXAMPLES 19–40

Silicon-containing polymers represented by formula I, silicon-containing polymers represented by formula II (for some Examples), and a photosensitive agent were dissolved in ethylcellosolve acetate, thereby preparing photosensitive compositions of the respective Examples. The silicon-containing polymers of formula I and II, the sensitive agents, and mixing ratios thereof in the respective Examples are listed in Tables 8 to 14 below.

The photosensitive compositions of the respective Examples were applied to the two-layer resist system as follows.

First, a solution of novolak resist "OFPR-800" (tradename) available from Tokyo Oyo Kagaku K.K. was applied and dried on a silicon substrate. Then, the resultant structure was heated at 200° C. for 30 minutes on a hot plate to form a 2.0-$\mu$m thick flattening layer. Subsequently, the photosensitive composition of each Example was applied and dried on the flattening layer to form a 0.5-$\mu$m thick photosensitive layer. Then, exposure and development were performed under the conditions listed in Tables 8 to 14, thereby forming an upper resist pattern.

Thereafter, the flattening layer was patterned by oxygen RIE using the upper resist pattern as an etching mask by dry etching apparatus "HiRRIE" (tradename) available from Tokuda Seisakusho K.K. Conditions of the oxygen RIE were $2 \times 10^{-2}$ torr, and output of 300 W/cm$^2$, an oxygen gas pressure of 4 pa, and a flow rate of 50 SCCM.

In the above two-layer resist system, the oxygen-RIE resistance of the upper resist pattern and resolution of the formed resist pattern of a two-layer structure were examined. Results are summarized in Tables 8 to 15 below. Note that the oxygen-RIE resistance of the upper resist pattern was represented as a ratio with respect to the oxygen-RIE resistance of the flattening layer.

TABLE 8

| | Composition of silicon-containing resist | | | Process condition | | | Evaluation | |
|---|---|---|---|---|---|---|---|---|
| | (a) Structure unit of polymer of formula (I) | (b) Structure unit of polymer of formula (II) | (c) Photosensitive agent | Mixing ratio of (a), (b), and (c) | Exposure light | Exposure amount (sensitivity) | Developer | Two-layer pattern resolution (μm) | Oxygen-RIE resistance with respect to flattening layer |
| Example 19 | (a-1) | (b-1) | (c-1) | 20:60:20 | Electron beam | 10 μC/cm² | 2.5% aqueous tetramethyl-ammonium hydroxy (TMAH) solution | 0.2 | 15 |
| Example 20 | (a-2) | (b-2) | (Same as c-1) | 40:20:20 | deep UV (250 W high-voltage mercury lamp) | 180 mJ/cm² | 2.5% aqueous TMAH solution | 0.4 | 15 |
| Example 21 | (a-3) | (b-3) | (c-2) | 50:30:20 | g-line (stepper) | 70 mJ/cm² | 2.0% aqueous TMAH solution | 0.5 | 16 |

TABLE 9

Composition of silicon-containing resist

| | a) Structure unit of polymer of formula (I) | b) Structure unit of polymer of formula (II) | c) Photosensitive agent | Mixing ratio of a), b), and c) |
|---|---|---|---|---|
| Example 22 | a-1) HO, OH, -OH, CH₂CH₂Si(CH₃)₃, C-H | | c-1) N₃-C₆H₄-SO₂-C₆H₄-N₃ | 80:0:20 |
| Example 23 | a-2) OH, -OH, CH₂CH₂Si(CH₃)₃, C-H | | Same as c-1) | 80:0:20 |
| Example 24 | a-3) [OH, CH₂, CH(CH₃), CH₂Si(CH₃)₃]₇₀ [OH, CH₂, CH₃]₃₀ | | c-2) benzophenone with DO*, OD*, OH groups | 80:0:20 |

Process condition and Evaluation

| | Exposure light | Exposure amount (sensitivity) | Developer | Two-layer pattern resolution (μm) | Oxygen-RIE resistance with respect to flattening layer |
|---|---|---|---|---|---|
| Example 22 | Electron beam | 20 μC/cm² | 2.5% aqueous tetramethyl-ammonium hydroxy (TMAH) solution | 0.2 | |
| Example 23 | deep UV (250 W high-voltage mercury lamp) | 70 mJ/cm² | 2.5% aqueous TMAH solution | 0.4 | |
| Example 24 | g-line (stepper) | 70 mJ/cm² | 2.0% aqueous TMAH solution | 0.5 | 16 |

TABLE 10

Composition of silicon-containing resist

| | a) Structure unit of polymer of formula (I) | b) Structure unit of polymer of formula (II) | c) Photosensitive agent | Mixing ratio of a), b), and c) |
|---|---|---|---|---|
| Example 25 | a-4) HO, OH, -OH, CH₂Si(CH₃)₃, C-H | Same as b-3) of Table 8 | Same as c-2) of Table 8 | 30:50:20 |
| Example 26 | a-5) OH, CH₂Si(CH₃)₂-O-Si(CH₃)₃, C-H, OH | b-4) OH, OCH₃, HCCH₃, [Si(C₆H₅)(CH₃)-O]₉₀[Si(CH₂CH₂CH₂OCOC(CH₃)=CH₂)-O]₁₀ | Same as c-1) of Table 8 | 50:30:20 |

TABLE 10-continued

| | a) | b) | c) | Mixing ratio |
|---|---|---|---|---|
| Example 27 | a-6) 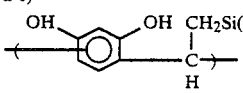 | b-5) 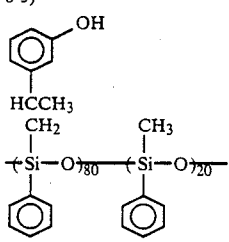 | Same as c-2) of Table 8 | 40:35:20 |

| | Process condition | | | Evaluation | |
|---|---|---|---|---|---|
| | Exposure light | Exposure amount (sensitivity) | Developer | Two-layer pattern resolution (μm) | Oxygen-RIE resistance with respect to flattening layer |
| Example 25 | g-line (stepper) | 70 mJ/cm² | 1.5% aqueous TMAH solution | 0.5 | 18 |
| Example 26 | Electron beam | 10 μC/cm² | 2.5% aqueous TMAH solution | 0.2 | 17 |
| Example 27 | g-line (stepper) | 70 mJ/cm² | 2.38% aqueous TMAH solution | 0.5 | 15 |

TABLE 11

| Composition of silicon-containing resist | | | | |
|---|---|---|---|---|
| a) Structure unit of polymer of formula (I) | b) Structure unit of polymer of formula (II) | c) Photosensitive agent | Mixing ratio of a), b), and c) | |
| Example 28 a-4) 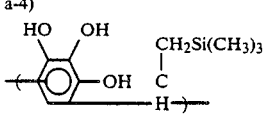 | | Same as c-2) of Table 8 | 30:50:20 | |
| Example 29 a-5) 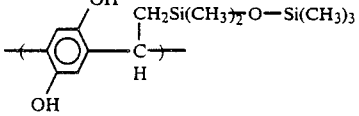 | | Same as c-1) of Table 8 | 50:30:20 | |
| Example 30 a-6) 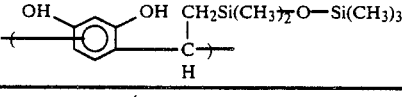 | | Same as c-2) of Table 8 | 40:35:20 | |

| | Process condition | | | Evaluation | |
|---|---|---|---|---|---|
| | Exposure light | Exposure amount (sensitivity) | Developer | Two-layer pattern resolution (μm) | Oxygen-RIE resistance with respect to flattening layer |
| Example 28 | g-line (stepper) | 70 mJ/cm² | 1.5% aqueous TMAH solution | 0.5 | 10 |
| Example 29 | Electron beam | 15 μC/cm² | 2.5% aqueous TMAH solution | 0.2 | 10 |
| Example 30 | g-line (stepper) | 70 mJ/cm² | 2.38% aqueous TMAH solution | 0.5 | 8 |

TABLE 12

| | Composition of silicon-containing resist | | | | Process condition | | | Evaluation | |
|---|---|---|---|---|---|---|---|---|---|
| | a) Structure unit of polymer of formula (I) | b) Structure unit of polymer of formula (II) | c) Photosensitive agent | Mixing ratio of a), b), and c) | Exposure light | Exposure amount (sensitivity) | Developer | Two-layer pattern resolution (μm) | Oxygen-RIE resistance with respect to flattening layer |
| Example 31 | a-7) [structure with OH, CH₂, OCH₃, CHC₂H₅, Si(CH₃)₃, 50/50] | | Same as c-2) of Table 8 | 80:0:20 | g-line (stepper) | 70 mJ/cm² | 1.5% aqueous TMAH solution | 0.5 | 7 |
| Example 32 | a-8) [structure with OH, CH₂, Si(CH₃)₂—Si(CH₃)₃, 40/60] | | Same as c-1) of Table 8 | 80:0:20 | Electron beam | 20 μC/cm² | 2.5% aqueous TMAH solution | 0.2 | 8 |
| Example 33 | a-9) [structure with OH, CH₂, CH, CH₃, CH₂Si(CH₃)₂O Si(CH₃)₃, 60/40] | | Same as c-2) Table 8 | 80:0:20 | g-line (stepper) | 70 mJ/cm² | 2.38% aqueous TMAH solution | 0.5 | 8 |

TABLE 13

| | Composition of silicon-containing resist | | | | Process condition | | | Evaluation | |
|---|---|---|---|---|---|---|---|---|---|
| | a) Structure unit of polymer of formula (I) | b) Structure unit of polymer of formula (II) | c) Photosensitive agent | Mixing ratio of a), b), and c) | Exposure light | Exposure amount (sensitivity) | Developer | Two-layer pattern resolution (μm) | Oxygen-RIE resistance with respect to flattening layer |
| Example 34 | a-10) | | c-1) 3-N₃-C₆H₄-SO₂-C₆H₄-N₃ | 75:0:20 | Electron beam | 18 μC/cm² | 2.5% aqueous TMAH solution | 0.2 | 8 |
| Example 35 | a-11) | | Same as c-1 | 75:0:20 | deep UV (250 W high-voltage mercury lamp) | 100 mJ/cm² | 2.5% aqueous TMAH solution | 0.5 | 9 |
| Example 36 | a-12) | | c-2) (diazonaphthoquinone ester, OD*/OH on phenol-benzoyl) | 80:0:20 | g-line (stepper) | 70 mJ/cm² | 2.0% aqueous TMAH solution | 0.5 | 9 |

Structure a-10): copolymer with repeat units — (OH-phenyl-CH(CH₂CH₂Si(CH₃)₃)—)₅₀ and (OH-(CH₃)(CH₂Si(CH₃)₃)-phenyl-C(CH₂Si(CH₃)₃)—)₅₀

Structure a-11): (OH-phenyl-CH(CH₂Si(CH₃)₃)—CH₂—Si(CH₃)₃ unit)

Structure a-12): terpolymer — (OH-(CH₃)(CH₂)-phenyl—)₅₀ / (OH-(CH₃)(CH₂)-phenyl—)₃₀ / (OH-(CH₂)(CH₃)-phenyl—)₂₀ with Si(CH₃)₂—O—Si(CH₃)₃ substituent

TABLE 14

| | Composition of silicon-containing resist | | | | Process condition | | | Evaluation | |
|---|---|---|---|---|---|---|---|---|---|
| | a) Structure unit of polymer of formula (I) | b) Structure unit of polymer of formula (I) | c) Photosensitive agent | Mixing ratio of a), b), and c) | Exposure light | Exposure amount (sensitivity) | Developer | Two-layer pattern resolution (μm) | Oxygen-RIE resistance with respect to flattening layer |
| Example 37 | a-13) [structure with $CH_2Si(CH_3)_3$ groups] | | c-3) [structure shown] | 70:0:25 | deep UV 250 W (high-voltage mercury lamp) | 100 mJ/cm² | 2.38% aqueous TMAH solution | 0.4 | 10 |
| Example 38 | Same as a-7) of Table 12 | Same as b-5) of Table 10 | c-3) | 40:35:25 | deep UV 250 W (high-voltage mercury lamp) | 180 mJ/cm² | 2.38% aqueous TMAH solution | 0.4 | 12 |
| Example 39 | Same as a-9) of Table 12 | Same as b-5) of Table 10 | c-3) | 40:35:25 | i-line (stepper) | 70 mJ/cm² | 2.38% aqueous TMAH solution | 0.5 | 15 |

TABLE 15

| | Composition of silicon-containing resist | | | |
|---|---|---|---|---|
| | a) Structure unit of polymer of formula (I) | b) Structure unit of polymer of formula (I) | c) Photosensitive agent | Mixing ratio of a), b), and c) |
| Example 40 | Same as a-10) of Table 13 | Same as b-5) of Table 8 | Same as c-2) of Table 8 | 30:45:25 |

| | Process condition | | | Evaluation | |
|---|---|---|---|---|---|
| | Exposure light | Exposure amount (sensitivity) | Developer | Two-layer pattern resolution (μm) | Oxygen-RIE resistance with respect to flattening layer |
| Example 40 | g-line (stepper) | 70 mJ/cm² | 2.38% aqueous TMAH solution | 0.5 | 15 |

What is claimed is:

1. A photosensitive composition comprising:
a polymer having a unit represented by formula I

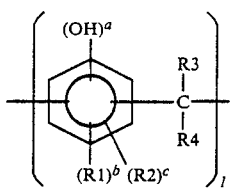

(I)

wherein
each of $R_1$ to $R_4$ represents a hydrogen atom, an alkyl group, an alkoxy group, a substituted or non-substituted allyl group, or these groups containing silicon, at least $R_3$ or $R_4$ being a silicon containing alkyl group having 1 to 10 carbon atoms a carbon atom of which is directly attached to the main chain of the polymer represented by formula I;
l represents a positive integer; and
each of a and b represents an integer from 1 to 3, and c represents an integer from 0 to 2, $a+b+c$ not exceeding 4,
in admixture with a photosensitive effective amount of at least one photosensitive agent selected from the group consisting of a negative type azide compound, a positive type benzoquinone diazide compound and positive type naphthoquinone diazide compound.

2. A composition according to claim 1, wherein said polymer having the unit represented by formula I is synthesized by condensing an organic silicon compound represented by formula III with an aldehyde:

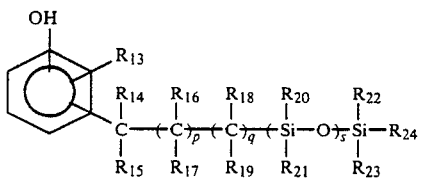

(III)

wherein
$R_{13}$: a hydrogen atom, a hydroxyl group, or an alkoxy group;
$R_{14}$ to $R_{24}$, being all the same or different: a hydrogen atom, an alkyl group having 1 to 10 carbon atoms, a substituted or nonsubstituted naphthyl group:
p and q: 0 or 1; and
s: a positive integer.

3. A composition according to claim 1, wherein said polymer having the unit represented by formula I is synthesized by condensing an organic silicon compound represented by formula IV with an aldehyde:

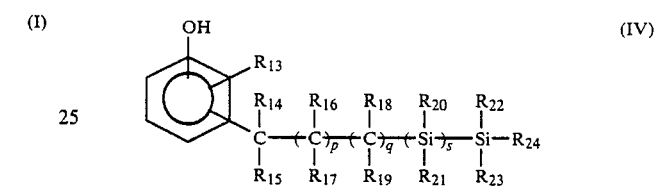

(IV)

wherein
$R_{13}$: a hydrogen atom, a hydroxyl group;, or an alkoxy group;
$R_{14}$ to $R_{24}$, being all the same or different: a hydrogen atom, an alkyl group having 1 to 10 carbon atoms, a substituted or nonsubstituted phenyl group, or a substituted or nonsubstituted naphthyl group:
p and q: 0 or 1; and
s: a positive integer.

4. A composition according to claim 2, wherein said polymer having the unit represented by formula I is synthesized by adding and mixing a phenol or phenol derivative not containing silicon with the organic silicon compound represented by formula III and condensing the resultant mixture with an aldehyde.

5. A composition according to claim 4, wherein the ratio of the organic silicon compound represented by formula III in said mixture is 20 to 80 mol %.

6. A composition according to claim 3, wherein said polymer having the unit represented by formula I is synthesized by adding and mixing a phenol or phenol derivative not containing silicon with the organic silicon compound represented by formula IV and condensing the resultant mixture with an aldehyde.

7. A composition according to claim 6, wherein the ratio of the organic silicon compound represented by formula IV in said mixture is 20 to 80 mol %.

8. A composition according to claim 1 wherein, said polymer having the unit represented by formula I is synthesized by condensing a carbonyl compound represented by formula V and a phenol or phenol derivative:

(V)

wherein each of $R_{25}$ and $R_{26}$ represents a hydrogen atom, an allyl group or an alkyl group containing silicon and having 1 to 15 carbon atoms, at least one of $R_{25}$ and $R_{26}$ being an alkyl group containing silicon and having 1 to 15 carbon atoms.

9. A composition according to claim 1, further comprising:

a polymer having a unit represented by formula II:

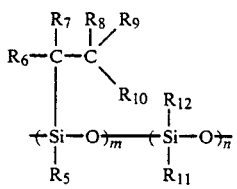

(II)

wherein $R_5$: an alkyl group having 1 to 10 carbon atoms or a substituted or nonsubstituted aryl group;

$R_6$ to $R_{10}$: a hydrogen atom, a halogen atom, an alkyl group, an allyl group, a halogenoalkyl group, a cyanoalkyl group, a carboxyl group, an alkylcarboxyl group, an alkoxycarboxyl group, an alkoxyl group, an acyloxyl group, an aryl group, or an alkyl-substituted aryl group, at least one of $R_6$ to $R_{10}$ being an aryl group substituted by a hydroxyl group;

$R_{11}$ and $R_{12}$: a vinyl group, an allyl group, a γ-methacryloxypropyl group, an alkyl group having 1 to 10 carbon atoms, a substituted or nonsubstituted aryl group, or a substituted or nonsubstituted siloxyl group;

m: a positive integer; n: 0 or a positive integer, wherein the mixing ratio A/(A+B) of polymer (A) having the unit represented by formula I and polymer (B) having the unit represented by formula II is 20 to 80 wt %.

10. A composition according to claim 1, wherein said photosensitive agent is an azide compound or naphthoquinon diazide compound.

11. A composition according to claim 10, wherein said photosensitive agent has sensitivity with respect to a g-line (wavelength: 436 nm) of a mercury emission spectrum.

12. A composition according to claim 11, wherein said photosensitive agent is bis(1-naphthoquinone-2-diazido-5-sulfonic acid)-2,3,4-trihydroxybenzophenone ester, tris(1-naphthoquinone-2-diazido-5-sulfonic acid)-2,3,4,4'-tetrahydroxybenzophenone ester, 1-(p-azidophenyl)-4-(2-furyl)-1,3-butadiene.

13. A composition according to claim 1, wherein the mixing ratio of said photosensitive agent is 5 to 100 parts by weight with respect to 100 parts by weight of said polymer.

14. A composition according to claim 1, further comprising an alkali soluble resin.

15. A composition according to claim 14, wherein said alkali soluble resin is a resin having phenolic hydroxy group.

16. A composition according to claim 14, wherein said alkali-soluble resin is present in an amount of 5 to 100 parts by weight with respect to 100 parts by weight of said polymer as the main component.

* * * * *